US010690740B2

(12) United States Patent
Trzasko (10) Patent No.: US 10,690,740 B2
(45) Date of Patent: Jun. 23, 2020

(54) SPARSE RECONSTRUCTION STRATEGY FOR MULTI-LEVEL SAMPLED MRI (71) Applicant: MAYO FOUNDATION FOR MEDICAL EDUCATION AND RESEARCH, Rochester, MN (US)

(72) Inventor: Joshua D. Trzasko, Rochester, MN (US)

(73) Assignee: Mayo Foundation for Medical Education and Research, Rochester, MN (US)

(*) Notice: Subject to any disclaimer, the term of this patent is extended or adjusted under 35 U.S.C. 154(b) by 439 days.

(21) Appl. No.: 15/523,433

(22) PCT Filed: Nov. 2, 2015

(86) PCT No.: PCT/US2015/058551
§ 371 (c)(1),
(2) Date: May 1, 2017

(87) PCT Pub. No.: WO2016/070167
PCT Pub. Date: May 6, 2016

(65) Prior Publication Data
US 2017/0299681 A1    Oct. 19, 2017

Related U.S. Application Data (60) Provisional application No. 62/073,995, filed on Nov. 1, 2014.

(51) Int. Cl.
*G01R 33/561*    (2006.01)
*G01R 33/563*    (2006.01)
(Continued)

(52) U.S. Cl.
CPC ...... *G01R 33/5611* (2013.01); *G01R 33/5635* (2013.01); *G01R 33/56308* (2013.01); *G01V 3/00* (2013.01); *G01V 3/14* (2013.01)

(58) Field of Classification Search
CPC ............ G01R 33/5611; G01R 33/5635; G01R 33/56308; G01V 3/00; G01V 3/14
(Continued)

(56) References Cited

U.S. PATENT DOCUMENTS 7,053,613 B2    5/2006 Lin
7,602,183 B2 *  10/2009 Lustig .................. G01R 33/561
                                                    324/307
(Continued)

FOREIGN PATENT DOCUMENTS

CN    103632341 A    3/2014
WO    2013103791 A1  7/2013
WO    2014006633 A1  1/2014

OTHER PUBLICATIONS

Bilen, et al., High-Speed Compressed Sensing Reconstruction in Dynamic Parallel MRI Using Augmented Lagrangian and Parallel Processing, IEEE Journal of Emerging and Selected Topics in Circuits and Systems, 2012, 2(3):370-379.
(Continued)

Primary Examiner — Dixomara Vargas
(74) Attorney, Agent, or Firm — Quarles & Brady LLP (57) ABSTRACT

Described here are systems and methods for reconstructing images from multi-level sampled data acquired with a magnetic resonance imaging (MRI) system. An alternating direction method-of multipliers (ADMM) strategy is implemented for sparse reconstruction of multi-level sampled data, and which decomposes the reconstruction problem into simpler subproblems and enables certain operations to be computed once offline and recycled during the reconstruction process rather than repeated at every iteration. As one example, the described reconstruction technique enables sparse reconstruction of 3D contrast-enhanced MR angio-
(Continued)

gram time-series in just several minutes rather than the several hours previously required.

16 Claims, 3 Drawing Sheets

(51) Int. Cl.
*G01V 3/14* (2006.01)
*G01V 3/00* (2006.01)

(58) Field of Classification Search
USPC .................. 324/300–322; 600/407–435; 382/128–131
See application file for complete search history.

(56) References Cited

U.S. PATENT DOCUMENTS

| | | | | |
|---|---|---|---|---|
| 7,817,838 | B2* | 10/2010 | DiBella | G01R 33/561 |
| | | | | 382/131 |
| 8,653,817 | B2 | 2/2014 | Busse et al. | |
| 8,675,942 | B2* | 3/2014 | Chang | G01R 33/4824 |
| | | | | 382/131 |
| 9,734,601 | B2* | 8/2017 | Bresler | G06T 11/006 |
| 2008/0197842 | A1* | 8/2008 | Lustig | G01R 33/561 |
| | | | | 324/307 |
| 2008/0272785 | A1 | 11/2008 | Crozier et al. | |
| 2008/0292163 | A1* | 11/2008 | DiBella | G01R 33/561 |
| | | | | 382/131 |
| 2008/0292167 | A1* | 11/2008 | Todd | G01R 33/4804 |
| | | | | 382/131 |
| 2012/0148129 | A1* | 6/2012 | Chang | G01R 33/4824 |
| | | | | 382/131 |
| 2012/0169338 | A1 | 7/2012 | King et al. | |
| 2013/0182930 | A1 | 7/2013 | Trzasko et al. | |
| 2015/0287223 | A1* | 10/2015 | Bresler | G06T 11/006 |
| | | | | 382/131 |
| 2017/0299681 | A1* | 10/2017 | Trzasko | G01V 3/00 |

OTHER PUBLICATIONS

Borisch, et al., Real-Time High-Throughput Scalable MRI Reconstruction via Cluster Computing, Proc. Intl. Soc. Mag. Reson. Med., 2008, 16:1492.

Boyd, et al., Distributed Optimization and Statistical Learning via the Alternating Direction Method of Multipliers, Foundations and Trends in Machine Learning, 2010, 3(1):1-122.

Haider, et al., 3D High Temporal and Spatial Resolution Contrast-Enhanced MR Angiography of the Whole Brain, Magnetic Resonance in Medicine, 2008, 60(3):749-760.

King, et al., A New Combination of Compressed Sensing and Data Driven Parallel Imaging, Proc. Intl. Soc. Mag. Reson. Med., 2010, 18:4881.

Lustig, et al., Sparse MRI: The Application of Compressed Sensing for Rapid MR Imaging, Magnetic Resonance in Medicine, 2007, 58:1182-1195.

Pruessmann, et al., SENSE: Sensitivity Encoding for Fast MRI, Magnetic Resonance in Medicine, 1999, 42:952-962.

Ramani, et al., Parallel MR Image Resconstruction Using Augmented Lagrangian Methods, IEEE Transactions on Medical Imaging, 2011, 30(3):694-706.

Saranathan, et al., Differential Subsampling With Cartesian Ordering (DISCO): A High Spatio-temporal Resolution Dixon Imaging Sequence for Multiphasic Contrast Enhanced Abdominal Imaging, Journal of Magnetic Resonance Imaging, 2012, 35:1484-1492.

Trzasko, et al., Local Versus Global Low-Rank Promotion in Dynamic MRI Series Reconstruction, Proc. Intl. Soc. Mag. Reson. Med., 2011, 19:4371.

Trzasko, et al., Sparse-CAPR: Highly Accelerated 4D CE-MRA With Parallel Imaging and Nonconvex Compressive Sensing, Magnetic Resonance in Medicine, 2011, 66:1019-1032.

Vasanawala, et al., Improved Pediatric MR Imaging with Compressed Sensing, Radiology, 2010, 256(2):607-616.

PCT International Search Report and Written Opinion, PCT/US2015/058551, dated Jan. 13, 2016, 10 pages.

* cited by examiner

SPARSE RECONSTRUCTION STRATEGY FOR MULTI-LEVEL SAMPLED MRI

CROSS-REFERENCE TO RELATED APPLICATIONS

This application represents the national stage entry of PCT International Application No. PCT/2015/058551 filed Nov. 2, 2015, which claims the benefit of U.S. Provisional Patent Application Ser. No. 62/073,995, filed on Nov. 1, 2014, both of which are incorporated herein by reference for al purposes.

BACKGROUND

The present disclosure relates to systems and methods for magnetic resonance imaging ("MRI"). More particularly, the present disclosure relates to systems and methods for reconstructing image from data acquired with an MRI system using a multi-level sampled data acquisition.

Sparsity-driven image reconstruction methods have shown great promise for improving spatial, temporal, and/or contrast resolution in many areas of MRI. However, due to their nonlinear nature, most sparse reconstruction methods are inherently iterative and may require the execution of many complex computational operations on large amounts of data at every iteration. Correspondingly, methods of this type remain substantially more computationally expensive than their direct, non-iterative analogs (e.g., standard SENSE) and as such have seen little translation into routine clinical practice.

MRI acquisition protocols that employ a multi-level sampling process (e.g., time-resolved CAPR) include those where the forward operator that relates the observed Fourier-domain MRI signal to the target image quantity can be factored into the product of a uniform and non-uniform sampling operator. Such multi-level sampling strategies are commonly employed for time-resolved MRI applications, where the uniform sampling operator is static and the non-uniform operator dynamically varies over time. However, existing sparse reconstruction methods typically do not leverage this property for multi-level sampled acquisitions, and operate using only the composite (i.e., forward and adjoint) sampling operators.

In light of the foregoing, there remains a need for developing sparsity-driven image reconstruction techniques that can efficiently take advantage of multi-level sampled data acquisitions.

SUMMARY OF THE INVENTION

The present invention overcomes the aforementioned drawbacks by providing a method for reconstructing an image from data acquired using a magnetic resonance imaging (MRI) system. Data are acquired from a subject using an MRI system, wherein the acquired data undersample k-space. An image of the subject is then reconstructed from the acquired data using an iterative reconstruction that is decomposed to include the following steps in each iteration: a data fidelity enforcing step; an aliasing unfolding step; a penalty transform inversion step; and a sparsity penalty enforcing step.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Described here are systems and methods for reconstructing magnetic resonance images. In general, images are reconstructed from data acquired using a multi-level data acquisition scheme, in which static, uniform sampling and dynamic, non-uniform sampling of k-space are implemented. Image reconstruction proceeds using an iterative reconstruction that is decomposed into a number of optimized subproblems. For instance, the iterative reconstruction can include a data fidelity enforcing subproblem, an aliasing unfolding subproblem, a penalty transform inversion subproblem, and a sparsity penalty enforcing subproblem.

As one specific example, an alternating direction method-of-multipliers ("ADMM") strategy is implemented for sparse, or low-rank, reconstruction of Cartesian SENSE-based parallel MRI data acquired with multi-level sampling protocols that specifically exploit their factorable structure. A significant advantage of this framework is that the ADMM subproblem corresponding to the uniform sampling component of the model has a closed-form solution and is wholly decoupled from the non-uniform sampling component. For time-resolved MRI applications, where the uniform sampling operator is static and the non-uniform component is dynamic, it follows that the inverse operator for the uniform sampling subproblem can be precomputed and subsequently applied for all time-frames in the MRI series. This unique property enables this ADMM scheme to operate very efficiently (e.g., by using only basic algebraic and unary operations) and to converge rapidly to a solution.

For a standard Cartesian, SENSE-type MRI exam where $T \geq 1$ time frames are acquired using a C-channel phased array receiver, the k-space (i.e., Fourier domain) signal observed at time index, t, can be modeled as:

$$G_t = \Phi_t F \mathrm{diag}(MX\delta_t)S + N_t \qquad (1);$$

where $G_t$ is a $K_t \times C$ data matrix at time index, t; $\Phi_t$ is a $K_t \times R$ non-uniform, dynamic, binary sampler; F is an $R \times N$ uniform, static, Fourier sampler; M is an $N \times M$ spatial support mask; X is an $M \times T$ time-varying image series; $\delta_t$ is a Kronecker delta; S is an $N \times C$ matrix of coil spatial sensitivity profiles; and $N_t$ is a $K_t \times C$ matrix of time-varying measurement noise.

All deterministic quantities, except X, are presumed known. Measurement noise in MRI is generally modeled as a proper complex Gaussian process that is temporally white, but possibly correlated, across receiver channels (i.e., $N[.,:]$ ~$\mathcal{CN}(0,\Psi)$ and thus $\mathbb{E}[N_t^*N_t]=K_t\Psi^T$. If $\Psi$ is known, *a priori*, then Eqn. (1) can be pre-whitened, yielding, $$G_tL=\Phi_tF\text{diag}(MX\delta_t)SL+N_tL \quad (2);$$

where L is the lower-triangular matrix resulting from a Cholesky decomposition of $\Psi^{-T}$ (i.e., $\Psi^{-T}=LL^*$). Letting $\hat{G}_t=G_tL$, $\hat{S}=SL$, and $\hat{N}_t=N_tL$, Eqn. (2) can be re-written as, $$\hat{G}_t=\Phi_tF\text{diag}(MX\delta_t)\hat{S}+\hat{N}_t \quad (3);$$

where $\hat{N}[.,:] \sim \mathcal{CN}(0,I)$. This model can be further simplified by vectorizing both sides of the equation, $$\hat{g}_t=vec(\hat{G}_t)=(I\oplus\Phi_tF)\hat{\Pi}MX\delta_t+\hat{n}_t \quad (4);$$

where "$\oplus$" denotes Kronecker's product and the modified coil sensitivity operator, $\hat{\Pi}$, is defined as, $$\hat{\Pi} = \begin{bmatrix} \text{diag}(S\delta_0) \\ \vdots \\ \text{diag}(S\delta_{C-1}) \end{bmatrix}. \quad (5)$$

Given Eqn. (4), the desire is to estimate X given $\hat{g}$. Because the measured data set contains both incomplete observations and noise, a maximum a posteriori ("MAP") estimation strategy can be implemented for this task. The MAP technique includes minimizing the additively-regularizing negative log-likelihood for $\hat{g}$, $$[\hat{X}] = \arg\min_{X\in C^{M\times T}}\{\mathcal{J}(X)\}; \quad (6)$$

where $$\mathcal{J}(X) \triangleq \lambda\mathcal{P}(\Gamma MX) + \sum_{t=0}^{T-1}\|(I\otimes\Phi_tF)\hat{\Pi}MX\delta_t - \hat{g}_t\|_2^2; \quad (7)$$

$\lambda > 0$ is a regularization parameter; $\Gamma$ is an optional linear sparsifying transform; and $\mathcal{P}(\cdot)$ is a low-rank or sparsity-promoting penalty functional.

Although there are many viable optimization strategies for solving Eqn. (6), the nested algebraic structure of the forward operator in this problem makes the ADMM strategy particularly attractive.

In lieu of directly minimizing $\mathcal{J}(\cdot)$ (e.g., via nonlinear conjugate gradient iteration), ADMM constructs a series of simpler subproblems from components of $\mathcal{J}(\cdot)$ and solves these subproblems serially. Typically, ADMM is used to decouple the non-smooth and nonlinear penalty, $\mathcal{P}(\cdot)$, from the fidelity term in $\mathcal{J}(\cdot)$, and to enable usage of closed-form proximal mappings. In the systems and methods described here, the temporally static and dynamic components of the forward system operator are additionally decoupled, which enables the precomputation and recycling of many algebraic forms and substantially reduced overall computational complexity. Three dummy variables and constraints are introduced to achieve this decoupling.

Note that the optimization problem in Eqn. (6) is equivalent to, $$[\hat{W},\hat{X},\hat{Y},\hat{Z}] = \arg\min_{W,X,Y,Z}\{\mathcal{J}(W,X,Y,Z)\}; \quad (8)$$

such that, $W=(I\oplus F)\hat{\Pi}MX$, $Y=MX$, and $Z=\Gamma Y$, and where, $$\mathcal{J}(W,X,Y,Z) \triangleq \lambda\mathcal{P}(Z) + \sum_{t=0}^{T-1}\|(I\otimes\Phi_t)W\delta_t - \hat{g}_t\|_2^2. \quad (9)$$

This is, of course, just one of many possible variable splitting constructions; however, an advantage of this specific variation is that the uniform (F) and non-uniform ($\Phi_t$) sampling components of the forward system operator are actively decoupled. The augmented Lagrangian for this constrained optimization problem is, $$\mathcal{L}(W,X,Y,Z,\eta_1,\eta_2,\eta_3) \triangleq \quad (10)$$
$$\mathcal{J}(W,X,Y,Z) + \mu_1\|W - (I\otimes F)\hat{\Pi}MX - \eta_1\|_F^2 +$$
$$\mu_2\|Y - MX - \eta_2\|_F^2 + \mu_3\|Z - \Gamma Y - \eta_3\|_F^2;$$

where $\eta_1$, $\eta_2$, and $\eta_3$ are Lagrange multiplier vectors and $\|\cdot\|_F$ denotes the Frobenius norm. In lieu of simultaneously optimizing over all variables, ADMM updates each variable separately and thus tackles a set of simplified subproblems rather than a single hard one. For Eqn. (10), the ADMM sequence can be follows in Table 1:

TABLE 1

Example ADMM Sequence for Multi-Level Sampled MRI

Example Algorithm for ADMM Sequence for Multi-Level Sampled MRI
initialize $Y_1 = \Lambda X_1$, $\eta_{1,1} = \eta_{2,1} = \eta_{3,1} = 0$;
for i = 1: maxIter
  $W_{i+1} = \text{argmin}_W \mathcal{L}(W, X_i, \bullet, \bullet, \eta_{1,i}, \bullet, \bullet)$
  $X_{i+1} = \text{argmin}_X \mathcal{L}(W_{i+1}, X, Y_i, \bullet, \eta_{1,i}, \eta_{2,i}, \bullet)$
  $Y_{i+1} = \text{argmin}_Y \mathcal{L}(\bullet, X_{i+1}, Y, Z_i, \bullet, \eta_{2,i}, \eta_{3,i})$
  $Z_{i+1} = \text{argmin}_Z \mathcal{L}(\bullet, \bullet, Y_{i+1}, Z, \bullet, \bullet, \eta_{3,i})$
  $\eta_{1,i+1} = \eta_{1,i} - (W_{i+1} - (I\otimes F)\hat{\Pi}MX_{i+1})$
  $\eta_{2,i+1} = \eta_{2,i} - (Y_{i+1} - MX_{i+1})$
  $\eta_{3,i+1} = \eta_{3,i} - (Z_{i+1} - \Gamma Y_{i+1})$
end Note that each iteration of this ADMM sequence includes solving four subproblems and performing three Lagrange multiplier updates (e.g., via dual ascent), which is a consequence of having introduced three surrogate variables into the optimization problem. The specific actions required to perform each step of Algorithm 1 are now described in detail.

The first subproblem of Algorithm 1, data fidelity enforcement, is quadratic and has a closed-form solution given by, $$W_{i+1} = \sum_{t=0}^{T-1}(I\otimes(\Phi_t^*\Phi_t + \mu_1 I)^{-1}R_t)\delta_t^*; \quad (11)$$

where $$R_t = (I\otimes\Phi_t^*)\hat{g}_t + \mu_1((I\otimes F)\hat{\Pi}MY_i + \eta_{1,i})\delta_t. \quad (12)$$

In words, Eqn. (11) replaces elements of the transform of the current image estimate with original data, or with a weighted average of original data and estimated values. Because $\Phi_t^*\Phi_t$ is a binary diagonal matrix, it is trivial to invert, and this subproblem can be solved in linear time.

The second subproblem of Algorithm 1, unfolding aliased information (e.g., SENSE inversion or the like), is also quadratic and has a closed-form solution given by, $$\tilde{X} = \left(M^*\hat{\Pi}^*(I \otimes F^*F)\hat{\Pi}M + \frac{\mu_2}{\mu_1}I\right)^{-1}R; \text{ where} \quad (13)$$

$$R = M^*\hat{\Pi}^*(I \otimes F^*)(W_{i+1} - \eta_{1,i}) + \frac{\mu_2}{\mu_1}M^*(Y_i - \eta_{2,i}). \quad (14)$$

In words, Eqn. (13) performs a SENSE-type unfolding of a linear combination of aliased variables. Note that MX, rather than X alone, is updated because only that quantity is needed by the ADMM scheme. Because F is a uniform Fourier sampler, this inverse problem can be solved by solving a set of small, independent matrix inversions. These inverse matrices do not change across iterations or frames, and can thus be precomputed (e.g., by Cholesky decomposition), stored, directly applied, and recycled. Thus, Eqn. (13) needs only be solved once rather than repeatedly during the reconstruction process.

The third subproblem of Algorithm 1, penalty transform inversion, is again quadratic and has a closed-form solution given by:

$$Y_{i+1} = \left(\Gamma^*\Gamma + \frac{\mu_2}{\mu_3}I\right)^{-1}(\Gamma(Z_i - \eta_{3,i}) + (MX_{i+1} + \eta_{2,i})). \quad (15)$$

In words, (15) forms an ensemble of several optimization variables and then eliminates the (a priori known) effects of sparsifying transformation. Stated another way, Eqn. (15) deconvolves the a priori known effects of the penalty transformation. As one example, in background subtracted CE-MRA, images are piecewise smooth and thus Γ is commonly defined as an ensemble of B finite spatial difference operators, $$\Gamma = \begin{bmatrix} \Gamma_1 \\ \vdots \\ \Gamma_B \end{bmatrix} = \begin{bmatrix} I - \Delta_1 \\ \vdots \\ I - \Delta_B \end{bmatrix} = \begin{bmatrix} A^*(I - P_1)A \\ \vdots \\ A^*(I - P_B)A \end{bmatrix}; \quad (16)$$

where, presuming periodic boundary conditions, A is the unitary discrete Fourier transform ("DFT"), $\Delta_b$ is a circular shift operator, and $P_b$ is a diagonal matrix representing the Fourier domain phase shift associated with b. Correspondingly, $$\Gamma^*\Gamma = 2A^*\left(\sum_{b=1}^B (I - Re\{P_b\})\right)A. \quad (17)$$

The $(\cdot)^{-1}$ term in Eqn. (15) is strictly diagonal, and solving this subproblem costs just over two fast Fourier transforms ("FFT").

The fourth subproblem of Algorithm 1 enforces the sparsity penalty in Eqn. (6). As one example, this penalty can be enforced via proximal mapping, which includes identifying a matrix, Z, such that the zero-matrix lies in the subgradient of $\mathcal{L}$ (',...,'), $$0 \in \frac{\lambda}{\mu_3}\partial\mathcal{P}(Z) + Z - \Gamma Y_{i+1} - \eta_{3,i}. \quad (18)$$

In words, solving Eqn. (18) corresponds to performing a denoising-type operation on a linear combination of the SENSE inversion result and a Lagrange multiplier. For example, if, $$\mathcal{P}(\cdot) = \|\cdot\|_{1,2} \quad (19)$$

which promotes joint sparsity between matrix rows, then, $$Z_{i+1} = JST_{\frac{\lambda}{2\mu_3}}\{\Gamma Y_{i+1} + \eta_{3,i}\}; \quad (20)$$

where JST{•} denotes the joint soft thresholding operator. Similarly, if, $$\mathcal{P}(\cdot) = \sum_{b \in \Omega} \|R_b \cdot\|_*; \quad (21)$$

which promotes local low-rankedness, then Eqn. (20) would utilize a block-wise singular value thresholding ("BSVT") operator instead of the joint soft thresholding operator.

Several steps of Algorithm 1 implement an R×N uniform Fourier sampling, F. If R is not an integer divisor of N (along each dimension), then F cannot be implemented using standard Fourier subset selection. However, presuming that sampling is aligned at index 0 (which is generally the case), F can be decomposed as, $$F = AT\sum_{p=1}^P \Delta_p; \quad (22)$$

where A is an R×R DFT operator, T is an R×N truncation operator, and $\Delta_p$ is a non-circular spatial shift operator. The number of shifts, P, is specific to the sampling scheme.

There are four variables that must be assigned for the proposed ADMM routine. The values of $\mu_1$, $\mu_2$, and $\mu_3$ determine the convergence rate of the algorithm, but do not effect the solution. For quadratic problems, values these can be automatically assigned to yield a desired condition number (e.g., a condition number of κ=100 can be targeted). This task only requires knowledge about of the range of eigenvalues of the target matrix, which can be determined analytically or numerically via power iteration. Only the regularization parameter, λ, which balances the reconstruction penalty and data fidelity objectives, is truly signal dependent and requires case-based assignment. As one example, λ can be is manually assigned based on visual assessment of results; however, this process can potentially be automated using tools like Stein's Unbiased Risk Estimator ("SURE").

Figure 1:
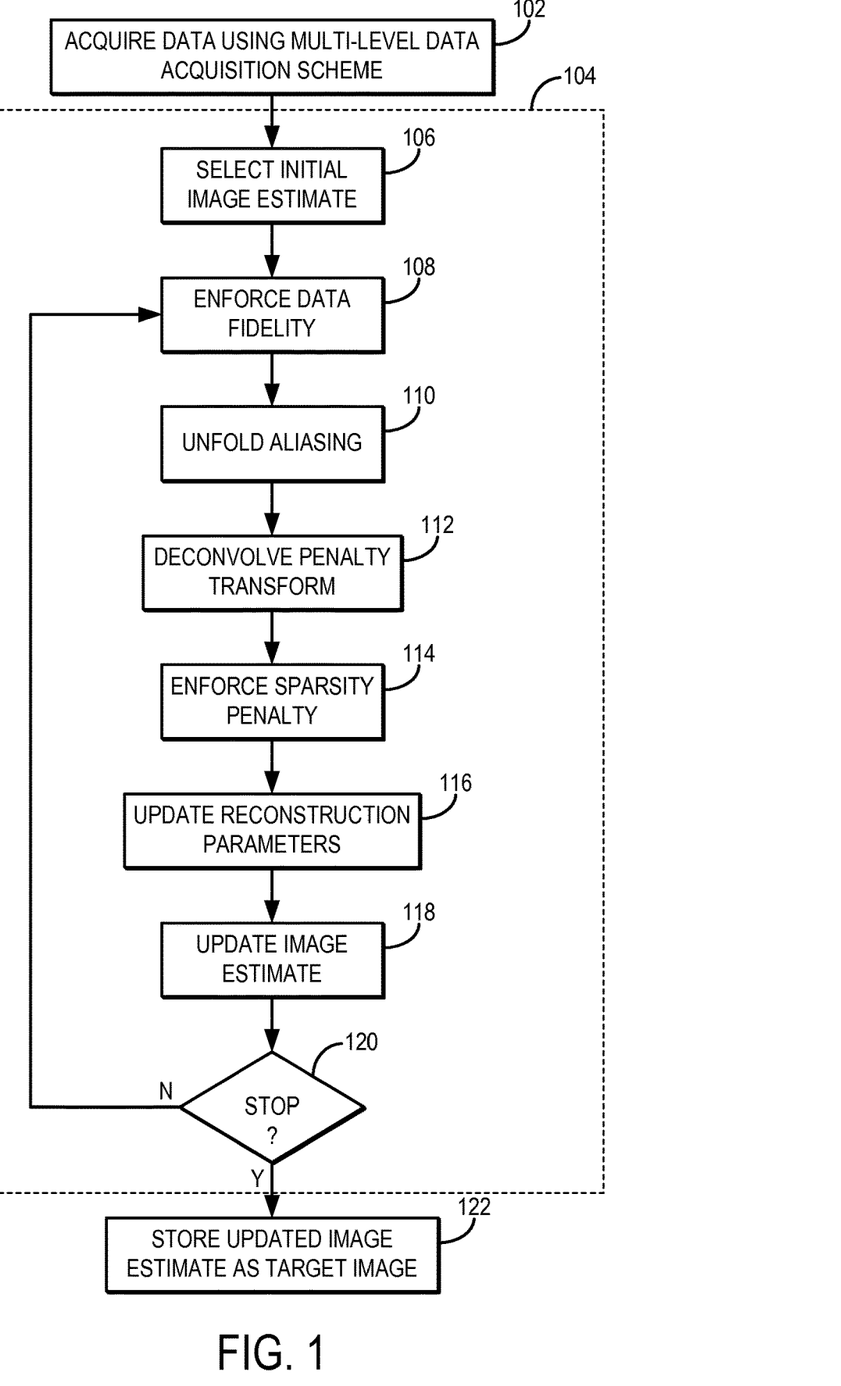
FIG. 1 is a flowchart setting forth the steps of an example method for reconstructing one or more images from data acquired with a magnetic resonance imaging ("MRI") system using a multi-level data acquisition.

Referring now to FIG. 1, a flowchart is illustrated as setting forth the steps of an example method for reconstructing an image of a subject from data acquired with an MRI system using a multi-level data acquisition scheme.

Figure 2:
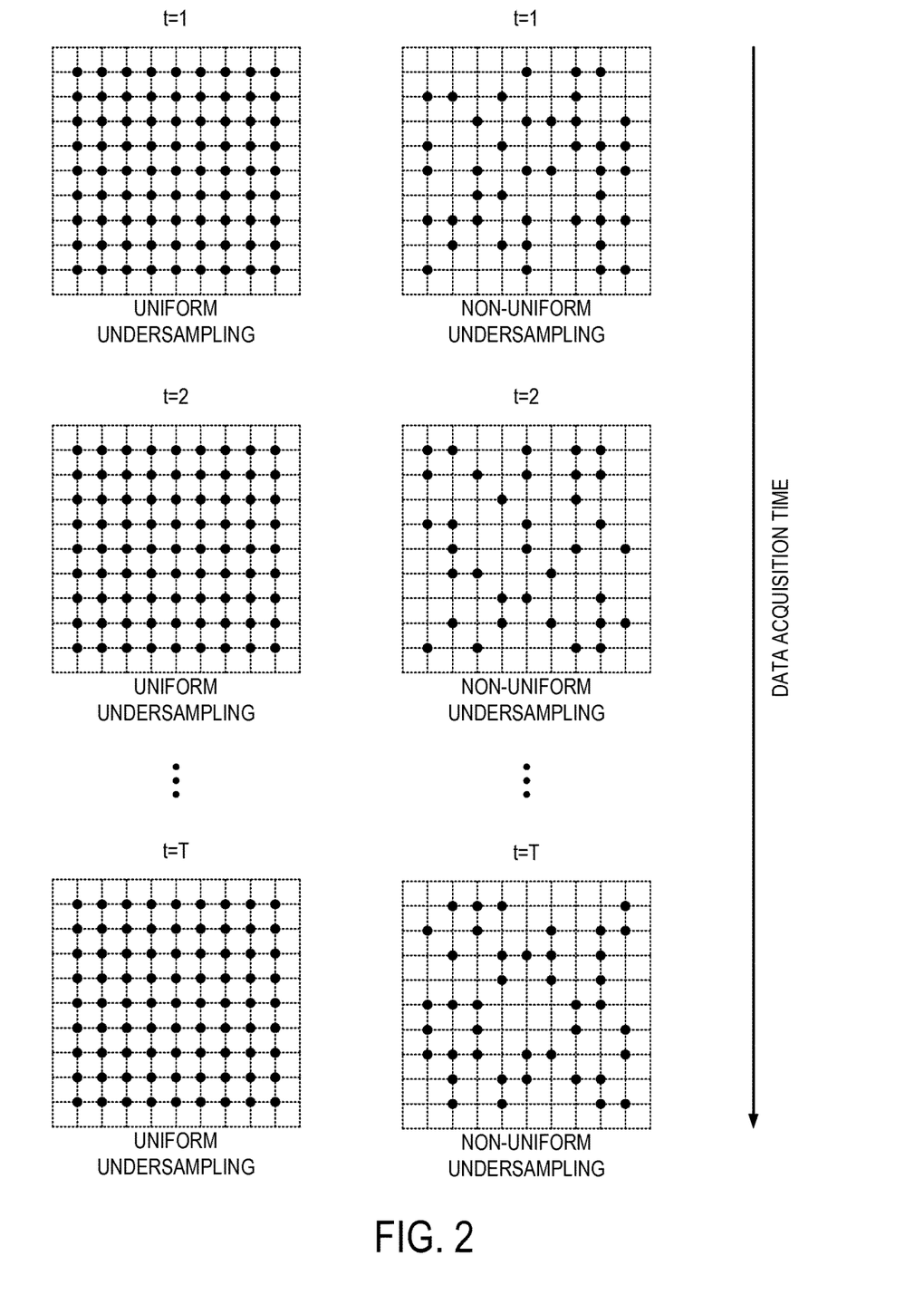
FIG. 2 illustrates an example of a multi-level data acquisition scheme, in which a static, uniform undersampling of k-space is implemented together with a dynamic, non-uniform undersampling of k-space.

The method thus includes acquiring, or otherwise providing previously acquired, data from a subject using an MRI system. Preferably, the data are acquired using a multi-level data acquisition scheme, in which some of the data are acquired using a uniform sampling pattern and some of the data are acquired using a non-uniform sampling pattern, an example of which is illustrated in FIG. 2. The uniform sampling pattern is static during the data acquisition, whereas the non-uniform sampling pattern varies dynamically during the data acquisition. Preferably, both the uniform and non-uniform sampling patterns undersample k-space.

Referring again to FIG. 1, from the acquired data, one or more images of the subject are reconstructed, as generally indicated at 104. In some embodiments, the acquired data are representative of a time series of image frames. In these instances, the image reconstruction process can include reconstructing the time series of image frames from the acquired data.

As described above in detail, the image reconstruction is generally an iterative reconstruction that includes four separate subproblems: a data fidelity enforcing step, an aliasing unfolding step, a penalty transform inversion step, and a sparsity penalty enforcing step. Because the reconstruction is iterative in nature, one or more initial image estimates are selected, as indicated at step 106. As one example, the initial image estimates can be images reconstructed from the acquired data using a conventional Fourier transform-based reconstruction; however, it will be appreciated by those skilled in the art that other selections for initial image estimates can also be made, whether based on the acquired data or otherwise.

The image reconstruction includes a data fidelity enforcing step, as indicated at step 108. For instance, this step can include implementing the data fidelity enforcing discussed above with respect to Eqn. (11).

The image reconstruction also includes an aliasing unfolding step, as indicated at step 110. For instance, this step can include implementing the aliasing unfolding discussed above with respect to Eqn. (13).

The image reconstruction also includes a penalty transform inversion step, as indicated at step 112. For instance, this step can include implementing the penalty transform inversion discussed above with respect to Eqn. (15).

The image reconstruction also includes a sparsity penalty enforcing step, as indicated at step 114. For instance, this step can include implementing the sparsity penalty enforcing discussed above with respect to Eqn. (18).

Based on the outputs of steps 108-114, reconstruction parameters are updated, as indicated at step 116. As one example, the reconstruction parameters are the Lagrange multipliers, $\mu_1$, $\mu_2$, and $\mu_3$, described above. For instance, Lagrange multiplier updates can be implemented via a dual ascent technique. Using these update parameters, the image estimate is updated, as indicated at step 118, after which a stopping criterion is evaluated at decision block 120. If the stopping criterion is not satisfied, then the reconstruction proceeds with the next iteration; otherwise, the updated image estimate is stored as the target image, as indicated at step 122.

In some embodiments, the image reconstruction can also include additional steps, such as an artifact correction step and a model-based parameter estimation step. As one example, an artifact correction step can include known operations for removing artifacts from magnetic resonance images. As another example, a model-based parameter estimation step can include a step where parameters (e.g., physical parameters including T1, T2) are estimated using a signal model, such as a magnetic resonance signal model based on the Bloch equations.

Thus, an optimization strategy for a general class of accelerated SENSE-based Cartesian MRI scenarios, where the Fourier sampling operator can be factored into a uniform and non-uniform component, has been described. This scenario commonly arises in dynamic or parametric MRI, where the uniform component is static over the sequence while the non-uniform component varies; however, this scenario can also arise in static imaging. Thus, the proposed reconstruction technique can be applied across a wide range of MRI applications. This reconstruction technique enables clinically practical utilization of sparse reconstruction technologies for very large scale MRI (e.g., 3D+time).

The proposed optimization framework can be used for standard anatomical imaging, fat-water imaging, or other quantitative MRI applications. Similarly, this strategy can be readily adapted for image reconstruction models based on other regularization and/or penalty methods, including but not limited to nonconvex and/or low-rank priors, as well as parallel imaging approaches other than SENSE, including but not limited to auto-calibrated methods.

The specific algorithm described above with respect to Table 1 represents only one possible implementation of the general multi-level sampling operator splitting concept discussed herein. It will be appreciated by those skilled in the art that other equivalent forms (possibly containing fewer or more subproblems) could provide the same or similar reconstruction functionality.

Figure 3:
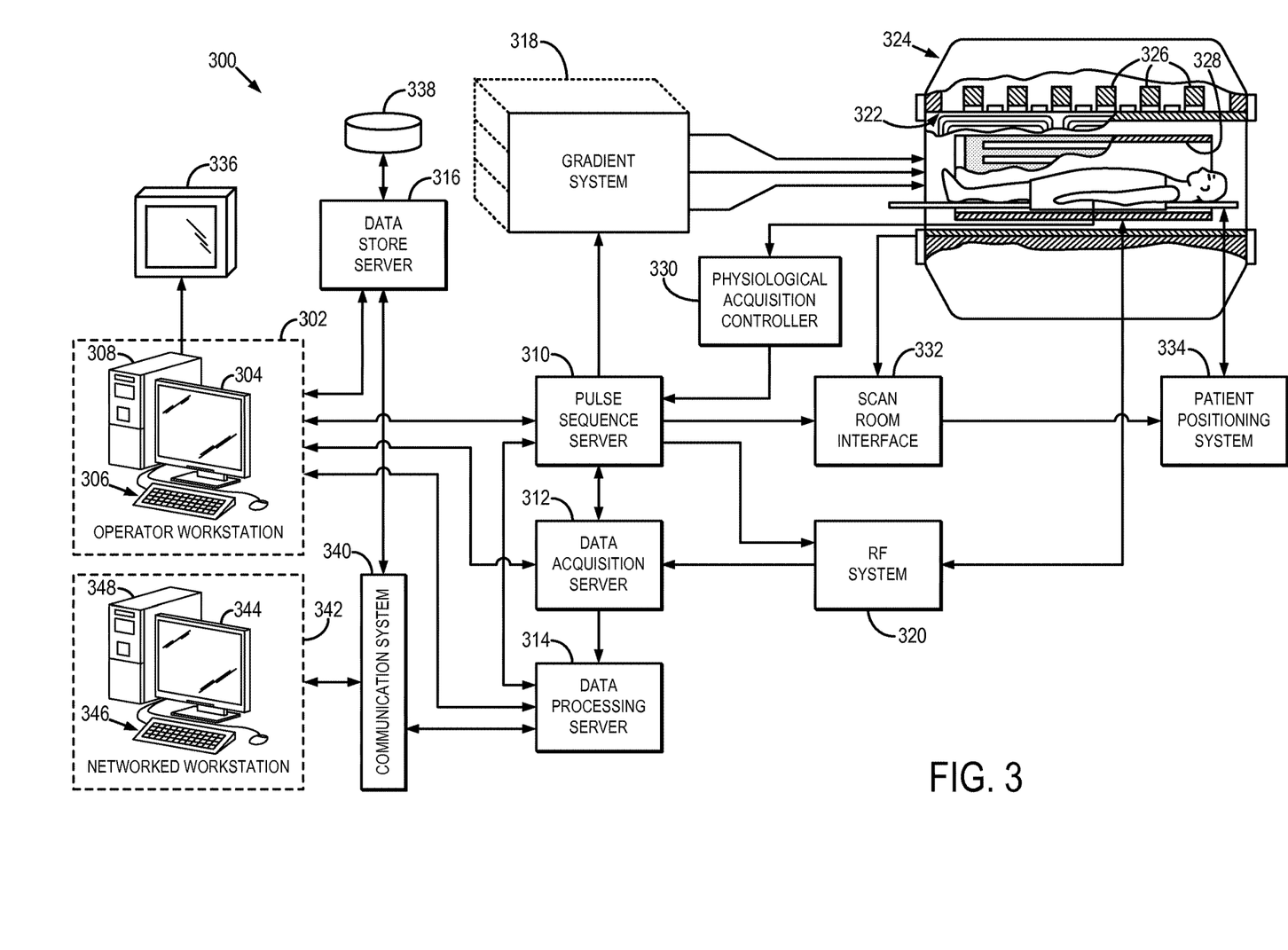
FIG. 3 is a block diagram of an example MRI system that can implement the present invention.

Referring particularly now to FIG. 3, an example of a magnetic resonance imaging ("MRI") system 300 is illustrated. The MRI system 300 includes an operator workstation 302, which will typically include a display 304; one or more input devices 306, such as a keyboard and mouse; and a processor 308. The processor 308 may include a commercially available programmable machine running a commercially available operating system. The operator workstation 302 provides the operator interface that enables scan prescriptions to be entered into the MRI system 300. In general, the operator workstation 302 may be coupled to four servers: a pulse sequence server 310; a data acquisition server 312; a data processing server 314; and a data store server 316. The operator workstation 302 and each server 310, 312, 314, and 316 are connected to communicate with each other. For example, the servers 310, 312, 314, and 316 may be connected via a communication system 340, which may include any suitable network connection, whether wired, wireless, or a combination of both. As an example, the communication system 340 may include both proprietary or dedicated networks, as well as open networks, such as the internet.

The pulse sequence server 310 functions in response to instructions downloaded from the operator workstation 302 to operate a gradient system 318 and a radiofrequency ("RF") system 320. Gradient waveforms necessary to perform the prescribed scan are produced and applied to the gradient system 318, which excites gradient coils in an assembly 322 to produce the magnetic field gradients $G_x$, $G_y$, and $G_z$ used for position encoding magnetic resonance signals. The gradient coil assembly 322 forms part of a magnet assembly 324 that includes a polarizing magnet 326 and a whole-body RF coil 328.

RF waveforms are applied by the RF system 320 to the RF coil 328, or a separate local coil (not shown in FIG. 3), in order to perform the prescribed magnetic resonance pulse sequence. Responsive magnetic resonance signals detected by the RF coil 328, or a separate local coil (not shown in FIG. 3), are received by the RF system 320, where they are amplified, demodulated, filtered, and digitized under direction of commands produced by the pulse sequence server 310. The RF system 320 includes an RF transmitter for producing a wide variety of RF pulses used in MRI pulse sequences. The RF transmitter is responsive to the scan prescription and direction from the pulse sequence server 310 to produce RF pulses of the desired frequency, phase, and pulse amplitude waveform. The generated RF pulses may be applied to the whole-body RF coil 328 or to one or more local coils or coil arrays (not shown in FIG. 3).

The RF system 320 also includes one or more RF receiver channels. Each RF receiver channel includes an RF preamplifier that amplifies the magnetic resonance signal received by the coil 328 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M = \sqrt{I^2 + Q^2} \tag{23};$$

and the phase of the received magnetic resonance signal may also be determined according to the following relationship:

$$\varphi = \tan^{-1}\left(\frac{Q}{I}\right). \tag{24}$$

The pulse sequence server 310 also optionally receives patient data from a physiological acquisition controller 330. By way of example, the physiological acquisition controller 330 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 310 to synchronize, or "gate," the performance of the scan with the subject's heart beat or respiration.

The pulse sequence server 310 also connects to a scan room interface circuit 332 that receives signals from various sensors associated with the condition of the patient and the magnet system. It is also through the scan room interface circuit 332 that a patient positioning system 334 receives commands to move the patient to desired positions during the scan.

The digitized magnetic resonance signal samples produced by the RF system 320 are received by the data acquisition server 312. The data acquisition server 312 operates in response to instructions downloaded from the operator workstation 302 to receive the real-time magnetic resonance data and provide buffer storage, such that no data is lost by data overrun. In some scans, the data acquisition server 312 does little more than pass the acquired magnetic resonance data to the data processor server 314. However, in scans that require information derived from acquired magnetic resonance data to control the further performance of the scan, the data acquisition server 312 is programmed to produce such information and convey it to the pulse sequence server 310. For example, during prescans, magnetic resonance data is acquired and used to calibrate the pulse sequence performed by the pulse sequence server 310. As another example, navigator signals may be acquired and used to adjust the operating parameters of the RF system 320 or the gradient system 318, or to control the view order in which k-space is sampled. In still another example, the data acquisition server 312 may also be employed to process magnetic resonance signals used to detect the arrival of a contrast agent in a magnetic resonance angiography ("MRA") scan. By way of example, the data acquisition server 312 acquires magnetic resonance data and processes it in real-time to produce information that is used to control the scan.

The data processing server 314 receives magnetic resonance data from the data acquisition server 312 and processes it in accordance with instructions downloaded from the operator workstation 302. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 314 are conveyed back to the operator workstation 302 where they are stored. Real-time images are stored in a data base memory cache (not shown in FIG. 3), from which they may be output to operator display 302 or a display 336 that is located near the magnet assembly 324 for use by attending physicians. Batch mode images or selected real time images are stored in a host database on disc storage 338. When such images have been reconstructed and transferred to storage, the data processing server 314 notifies the data store server 316 on the operator workstation 302. The operator workstation 302 may be used by an operator to archive the images, produce films, or send the images via a network to other facilities.

The MRI system 300 may also include one or more networked workstations 342. By way of example, a networked workstation 342 may include a display 344; one or more input devices 346, such as a keyboard and mouse; and a processor 348. The networked workstation 342 may be located within the same facility as the operator workstation 302, or in a different facility, such as a different healthcare institution or clinic.

The networked workstation 342, whether within the same facility or in a different facility as the operator workstation 302, may gain remote access to the data processing server 314 or data store server 316 via the communication system 340. Accordingly, multiple networked workstations 342 may have access to the data processing server 314 and the data store server 316. In this manner, magnetic resonance data, reconstructed images, or other data may be exchanged between the data processing server 314 or the data store server 316 and the networked workstations 342, such that the data or images may be remotely processed by a networked workstation 342. This data may be exchanged in any suitable format, such as in accordance with the transmission control protocol ("TCP"), the internet protocol ("IP"), or other known or suitable protocols.

The present invention has been described in terms of one or more preferred embodiments, and it should be appreciated that many equivalents, alternatives, variations, and modifications, aside from those expressly stated, are possible and within the scope of the invention.

I claim:

1. A method for reconstructing an image from data acquired using a magnetic resonance imaging (MRI) system, the steps of the method comprising:
   (a) acquiring data from a subject using an MRI system, wherein the acquired data undersample k-space;

(b) reconstructing an image of the subject from the acquired data using an iterative reconstruction that is decomposed to include in each iteration:
a data fidelity enforcing step;
an aliasing unfolding step;
a penalty transform inversion step; and
a sparsity penalty enforcing step.

2. The method as recited in claim 1, wherein the data acquired in step (a) are acquired using a multi-level sampled data acquisition scheme.

3. The method as recited in claim 2, wherein the multi-level sampled data acquisition scheme includes a uniform sampling pattern that remains static during step (a) and a non-uniform sampling pattern that varies dynamically during step (a).

4. The method as recited in claim 1, wherein the data fidelity enforcing step includes replacing data elements in a forward transform of an image estimate in a current iteration with data acquired in step (a).

5. The method as recited in claim 1, wherein the data fidelity enforcing step includes replacing data elements in a forward transform of an image estimate in a current iteration with a weighted average of data acquired in step (a) and estimated data.

6. The method as recited in claim 1, wherein the aliasing unfolding step includes applying an unfolding matrix to an image estimate in a current iteration so as to unfold aliased information in the image estimate.

7. The method as recited in claim 6, wherein the unfolding matrix is a pre-computed unfolding matrix that is retrieved from data storage.

8. The method as recited in claim 6, wherein the unfolding matrix is computed based in part on coil sensitivity information associated with a radio frequency coil array used to acquire the data in step (a).

9. The method as recited in claim 6, wherein the unfolding matrix is computed based in part on autocalibration signals acquired with the data in step (a).

10. The method as recited in claim 1, wherein the penalty transform inversion step includes deconvolving known effects of a penalty transform in the iterative reconstruction.

11. The method as recited in claim 1, wherein the sparsity penalty enforcing step includes enforcing at least one of a sparsity penalty that promotes sparsity or a low-rank penalty that promotes low-rankedness.

12. The method as recited in claim 1, wherein the sparsity penalty enforcing step includes enforcing a sparsity penalty using a proximal mapping technique.

13. The method as recited in claim 1, wherein the sparsity penalty enforcing step includes enforcing a low rank penalty using a proximal mapping technique.

14. The method as recited in claim 1, wherein the iterative reconstruction includes updating the image using Lagrange multiplier updates in each iteration.

15. The method as recited in claim 1, wherein the iterative reconstruction further includes in each iteration, an artifact correction step.

16. The method as recited in claim 1, wherein the iterative reconstruction further includes in each iteration, a model-based parameter estimation step, wherein at least one parameter is estimated based on the acquired data.

* * * * *